(12) United States Patent  
Cheah (10) Patent No.: US 6,674,409 B2
(45) Date of Patent: Jan. 6, 2004

(54) BALANCED ANTENNA STRUCTURE FOR BLUETOOTH 2.4 GHZ PHYSICAL REGION SEMICONDUCTOR INTEGRATED CIRCUIT

(75) Inventor: Jonathon Cheah, San Diego, CA (US)

(73) Assignee: Microtune (San Diego), Inc., San Diego, CA (US)

( * ) Notice: Subject to any disclaimer, the term of this patent is extended or adjusted under 35 U.S.C. 154(b) by 77 days.

(21) Appl. No.: 10/016,178

(22) Filed: Dec. 5, 2001

(65) Prior Publication Data

US 2002/0186168 A1 Dec. 12, 2002

Related U.S. Application Data (60) Provisional application No. 60/251,496, filed on Dec. 5, 2000.

(51) Int. Cl.[7] .................................................. H01Q 9/28
(52) U.S. Cl. ................................ 343/795; 343/700 MS
(58) Field of Search .......................... 343/700 MS, 702, 343/795, 846, 848, 853; 455/83

(56) References Cited

U.S. PATENT DOCUMENTS

| 3,721,990 | A | * | 3/1973 | Gibson et al. | ............. 343/726 |
|---|---|---|---|---|---|
| 4,356,492 | A | * | 10/1982 | Kaloi | ................. 343/700 MS |
| 4,758,843 | A | | 7/1988 | Agrawal et al. | |
| 5,206,657 | A | | 4/1993 | Downey | |
| 5,262,791 | A | * | 11/1993 | Tsuda et al. | ......... 343/700 MS |
| 5,396,658 | A | * | 3/1995 | Hwu et al. | ................... 455/327 |
| 5,495,260 | A | | 2/1996 | Couture | |
| 5,627,550 | A | * | 5/1997 | Sanad | ................ 343/700 MS |
| 6,009,314 | A | * | 12/1999 | Bjork et al. | ................... 455/83 |
| 6,175,338 | B1 | * | 1/2001 | Quade | ........................ 343/795 |
| 6,252,561 | B1 | | 6/2001 | Wu et al. | |

* cited by examiner

Primary Examiner—Tan Ho
(74) Attorney, Agent, or Firm—Baker Botts, L.L.P.

(57) ABSTRACT

An antenna assembly and methods of use are disclosed. In one embodiment, the antenna assembly is formed on a substrate and includes a first metal region and a second metal region attached to a surface of the substrate. The second metal region may be separated from the first metal region by a gap. The second metal region may include a first pronged end and a second end that correspond, respectively, to a first pronged end and a second end of the first metal region. The pronged ends of each metal region are connected to the differential inputs and outputs of a transceiver coupled with the antenna assembly.

68 Claims, 7 Drawing Sheets

BALANCED ANTENNA STRUCTURE FOR BLUETOOTH 2.4 GHZ PHYSICAL REGION SEMICONDUCTOR INTEGRATED CIRCUIT

RELATED APPLICATIONS

This application hereby claims the benefit of the filing date of a U.S. Provisional Application entitled, BALANCED ANTENNA STRUCTURE FOR BLUETOOTH 2.4 GHZ PHYSICAL REGION SEMICONDUCTOR INTEGRATED CIRCUIT, Serial No. 60/251,496, filed on Dec. 5, 2000. The provisional application is hereby incorporated by reference into the present application.

FIELD OF THE INVENTION

The field of the invention relates to a balanced antenna assembly for use in electronics applications generally, and for use in Bluetooth-compatible wireless modules, particularly.

BACKGROUND OF THE INVENTION

A global de facto standard for wireless connectivity, Bluetooth is a short-range wireless communications specification adopted by Ericcson and later adopted by the Bluetooth Special Interest Group. Using a low-cost, short-range radio link, Bluetooth cuts the cords that used to tie up digital devices. When two Bluetooth equipped devices come within 10 meters range of each other, they can establish a connection together. And because Bluetooth utilizes a radio-based link, it doesn't require a line-of-sight connection in order to communicate. A Bluetooth-compatible laptop, for example, may send information to a printer in the next room. Alternatively, a microwave could send a message to a mobile phone telling a user that a meal is ready.

An important difference between wireless and wired communications is that a wireless device has a transmitting and a receiving portion, as well as an antenna for performing wireless signal communications. Conventionally, the antenna is a dipole formed by a metal rod or a helical cylinder extending out from the wireless device. Extendable antennas, however, suffer from a number of disadvantages, including: increased overall size of the wireless device, and a tendency to break off or to pierce a user of the wireless device, among others. The next generation of conventional antennas were folded within the housing of the wireless device. Though these retractable antennas could be drawn from the housing by the user, users often find it impractical to do so. As a result, reception sometimes suffers.

The third generation of antenna technology is a "printed-circuit antenna," sometimes called a "patch antenna." Such antennas are desirable because they are lightweight and often have a high directivity. Examples of printed-circuit antennas include: U.S. Pat. No. 6,252,561 to Wu et al., which is an example of a rectangular loop antenna printed on a dielectric substrate; U.S. Pat. No. 5,495,620 to Couture, which is an example of a simple dipole antenna realized in the form of a printed circuit antenna; U.S. Pat. No. 5,206,657 to Downey, which shows a printed circuit radio frequency antenna comprising a pair of double sided printed circuit boards spaced apart by standoffs; and U.S. Pat. No. 4,758,843 to Agrawal, which shows a planar printed circuit substrate having a plurality of dipole antennas and a feed network including a sum and difference hybrid printed circuit thereon.

The disadvantage of these and other prior art antennas is that they do not meet the stringent design goals of the Bluetooth specification, which requires that the cost of Bluetooth transceivers (and their corresponding antennas) approximately match the cost of the wire tethers they are designed to replace. This requirement imposes stringent design goals for the Bluetooth 2.4GHz transceiver, its microcontroller, and memory requirements, as well as the external antenna system that accompanies it. In order to meet this design specification, the external antenna structure must be carefully designed as an integral subsystem to complement the overall Bluetooth system design, which is encapsulated in a packaged semiconductor Radio Frequency Integrated Circuit (RFIC).

For example, known antenna designs for Bluetooth devices include simple metal notch, F-style, or L-style radiating elements. However, these radiating elements are highly unbalanced and cannot be used in a Bluetooth module. In principle, a simple dipole having a terminal impedance of about 73 Ω or about 300 Ω if folded can be utilized. At the 2.402 to 2.480 GHz Bluetooth frequencies, however, such a dipole measures approximately 60 mm long. For most Bluetooth devices, such dipole dimensions are extremely long, and do not satisfy the Bluetooth specification. Moreover, a particular system architecture may require separate radio frequency (RF) ports for the receive and transmit half-duplex functions. Additionally, the inactive impedances, (e.g., the input impedances of the semiconductor devices in their unbiased states) may not be very large because of the residual package parasitics. Thus a solution is needed that provides a balanced antenna structure having significantly reduced physical dimensions.

SUMMARY OF THE INVENTION

An antenna assembly and methods of use are disclosed. In one embodiment, the antenna assembly is formed on a substrate and includes a first metal region and a second metal region attached to a surface of the substrate. The second metal region may be separated from the first metal region by a gap. The second metal region may include a first pronged end and a second end that correspond, respectively, to a first pronged end and a second end of the first metal region. The pronged ends of each metal region are connected to the differential inputs and outputs of a transceiver coupled with the antenna assembly.

BRIEF DESCRIPTION OF THE DRAWINGS

Various aspects of the present invention are set forth by way of example, and not limitation, in the Figures of the accompanying drawings, in which.

DETAILED DESCRIPTION OF PREFERRED EMBODIMENTS

A Balanced Antenna Structure for a Bluetooth 3.4 GHz Physical Region Semiconductor Integrated Circuit is disclosed. In the following detailed description, numerous specific details are set forth in order to provide a thorough understanding of the present invention. However, it will be apparent to one of ordinary skill in the art that these specific details need not be used to practice the present invention. In other circumstances, well-known structures, materials, or processes have not been shown or described in detail in order not to unnecessarily obscure the present invention.

The Bluetooth physical region uses Gaussian Frequency Shift Keying Index (GFSK) modulation with a bandwidth and symbol timing product, BT=0.5 and a deviation or modulation index, h=0.28 to 0.35. In this scheme, a binary "1" is represented by a positive frequency deviation (from the carrier frequency) and a binary "0" is represented by a negative frequency deviation.

The "BT" product is the product (i.e., a mathematical multiplication operation) of the occupied bandwidth of a communication signal and the bit period thereof. It is used by engineers and others in the relevant art as a shorthand expression for communicating information regarding the effective band limiting of a transmittal signal. With Bluetooth, the bit period (T), which is an indication of the keying rate, is specified as 1 MHz. Thus, the available bandwidth for a transmitted signal to occupy (B) is 0.5 MHz.

The deviation index (h) is a measure of the difference in frequency for an FSK modulation scheme (as used by Bluetooth radios) between different bits. That is, the difference is the modulation frequency for transmission of a logical "1" versus a logical "0." Since the modulation frequency (or keying rate) is specified as 1 MHz and (h)=0.32, this gives a maximum deviation frequency of $f_D$=(0.32×1)/2 MHz–160 KHz.

The reason for the selection of the sub-minimum shift keying modulation index is to ensure that the Bluetooth transmit signal spectrum satisfies U.S. FCC Regulation Part 15.247, which requires a 20 dBc performance at 1 MHz channel spacing. The Bluetooth symbol rate is 1 Msps with 79 hopping frequency channels from 2.402 to 2.480 at 1 MHz intervals. Its output power is available in 3 classes: 0 dBm, 4 dBm, and 20 dBm. Bluetooth's minimum receive sensitivities must be better than–70 dBm for a received signal bit error rate (BER) of $10^{-3}$.

To overcome the high common mode noise contributions that exist in the 0.25 μm Complementary Metaloxide Semi-conductor (CMOS) devices and substrates, both the transmit output and the receive input must be differentially driven. Consequently, one embodiment of the antenna structure of the claimed invention provides balanced differential mode terminations. In addition, because there are three classes of transmit power levels, an embodiment of an associated transceiver and receiver may have independent antenna ports to facilitate the inclusion of an external power booster amplifier, whenever necessary, because the intended on-chip power amplifier (PA) is only able to deliver 0 dBm to the antenna port. Finally, it has been recommended by Bluetooth focus groups that the practical size of the Bluetooth module, inclusive of the antenna, should be approximately 3.0 by 1.0 $cm^2$.

Package Parasitics

Considering the overall systems requirements imposed on the antenna design, in concert with the semiconductor design, the immediate problem to overcome is the semiconductor parasitics. Because there is not much readily available data on the parasitics of commonly used semiconductor packages much higher than a few hundred MHz, the parasitics for a targeted Ball Grid Array (BGA) for various embodiments of the claimed antenna structure should be extracted independently.

Figure 1:
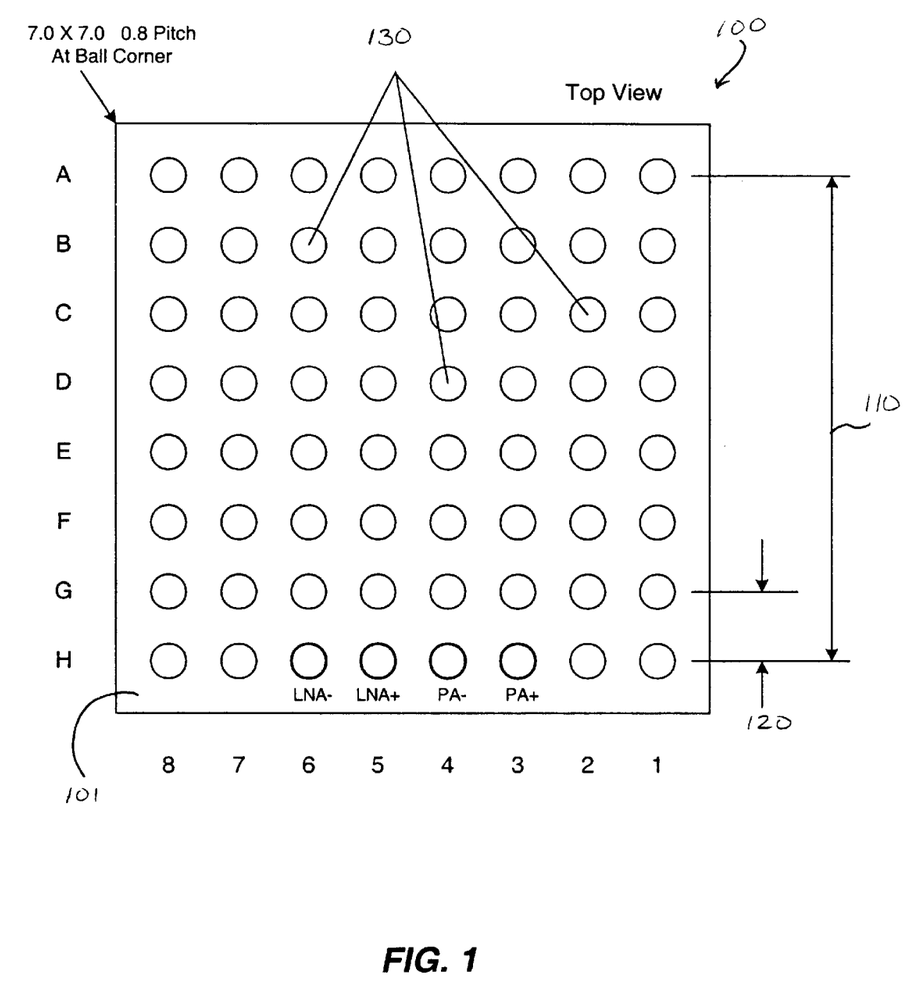
FIG. 1 is a plan view of a ball grid array from an integrated circuit.

FIG. 1 is a diagram of a BGA 100 that may be targeted for use with various embodiments of the claimed antenna structure. BGA 100 includes a dielectric substrate 101 to which are affixed a plurality of balls 130. The overall width and height 110 of the ball grid pattern measures about 5.50 mm. Balls 130 are separated by a center-to-center distance 120 of approximately 0.80 mm. As shown, BGA 100 includes designated ball locations for the differentially driven PA and Low Noise Amplifier (LNA) ports.

Figure 2:
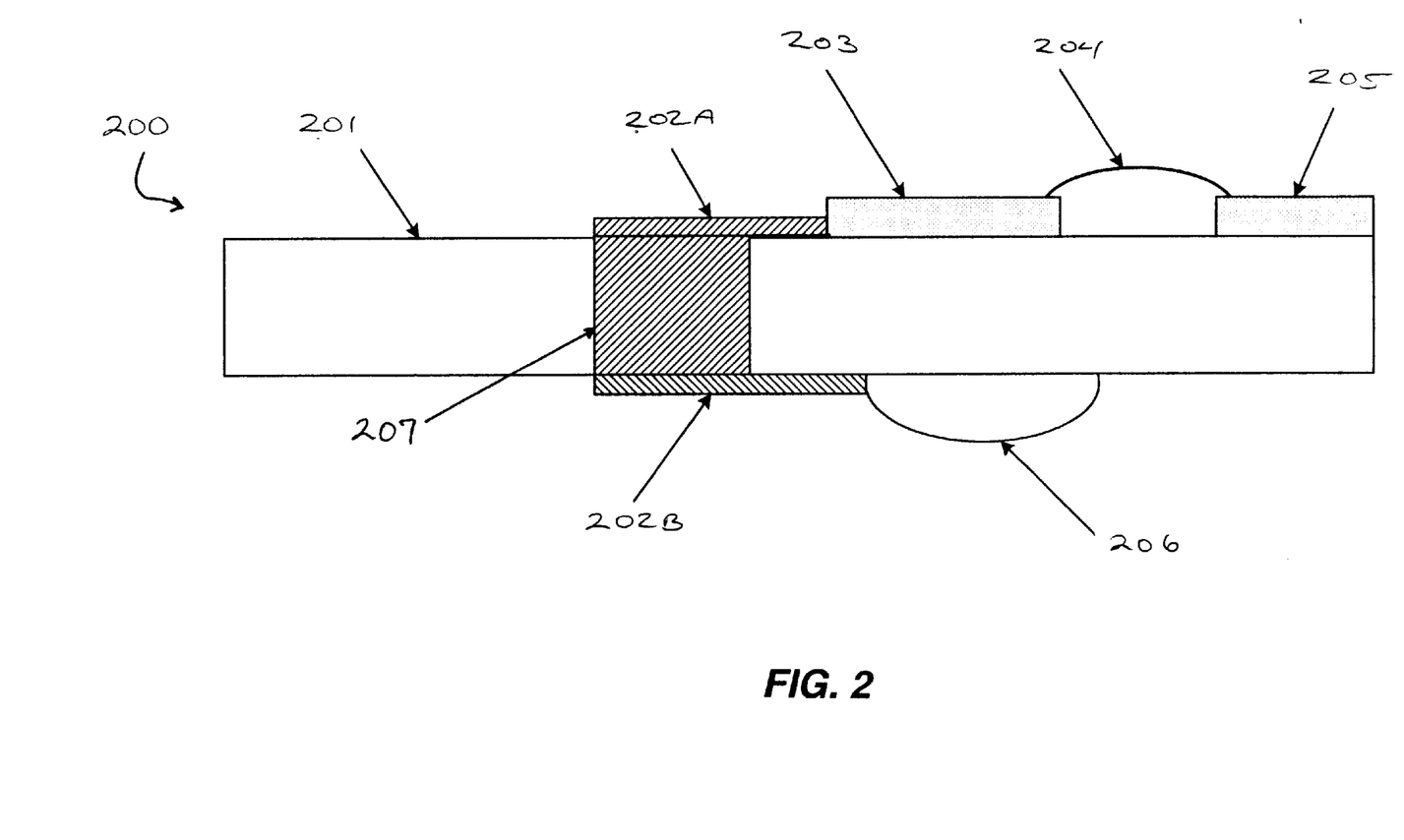
FIG. 2 is a cross-sectional side view of a section of the ball grid array shown in FIG. 1.

FIG. 2 is a cross-sectional side view of a section off the ball grid array shown in FIG. 1. This view provides a mechanical representation of the package parasitics extraction layout for one signal path for the 2.4 GHz radio frequency (RF) ports. As shown, BGA 200 includes a substrate 201, a via 207, traces 202A and 202B, package ball 206, and a substrate pad 203 connected to semiconductor pad 205 by gold bond wire 204. Referring to FIG. 8, a sample of the equivalent circuit representation of the package parasitics captured is listed in Table I. With the exception of series inductive matching components, most of the package parasitic components are absorbed into the output and input matching network of the PA and LNA, respectively. This permits a simplified antenna structure.

The Transmitter PA Antenna Port

Figure 5:
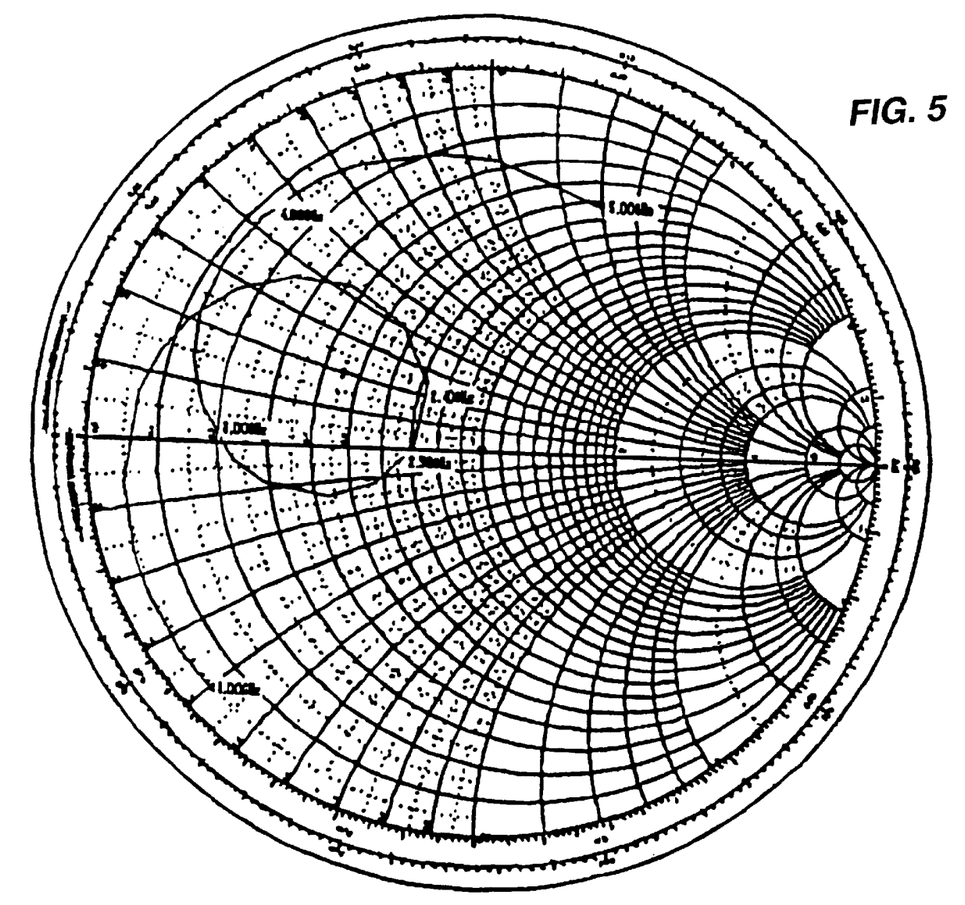
FIG. 5 is a Smith diagram showing a computer simulated projection of an expected PA S22 response when an output is matched to pre-determined package parasitics and to one embodiment of an antenna structure configured in accordance with the present invention.

In one embodiment, the PA may be a Class A amplifier design. Because Bluetooth adopts the GSFK modulation, a Class C amplifier may also be used, though implementing a Class C amplifier into a CMOS Radio Frequency Integrated Circuit (RFIC) may prove challenging. When a Class A amplifier is used, it is necessary to match the PA to the antenna. The antenna structure should provide intrinsic impedance much greater than 50 Ω because of the amount of PA drive current needed to provide at least 3 dBm of power output. With 3 dBm of output, it is possible to meet the Bluetooth specification requirement of 0 dBm at the antenna input after the package parasitics and antenna interconnection losses. In one embodiment, the PA output has an intrinsic impedance of approximately 300 Ω. The expected PA response (labeled $S_{22}$) when the output is matched to the package parasitics and to the antenna loads is shown in the computer-simulated diagram of FIG. 5.

The Receiver Low Noise Amplifier (LNA) Antenna Port

Figure 6:
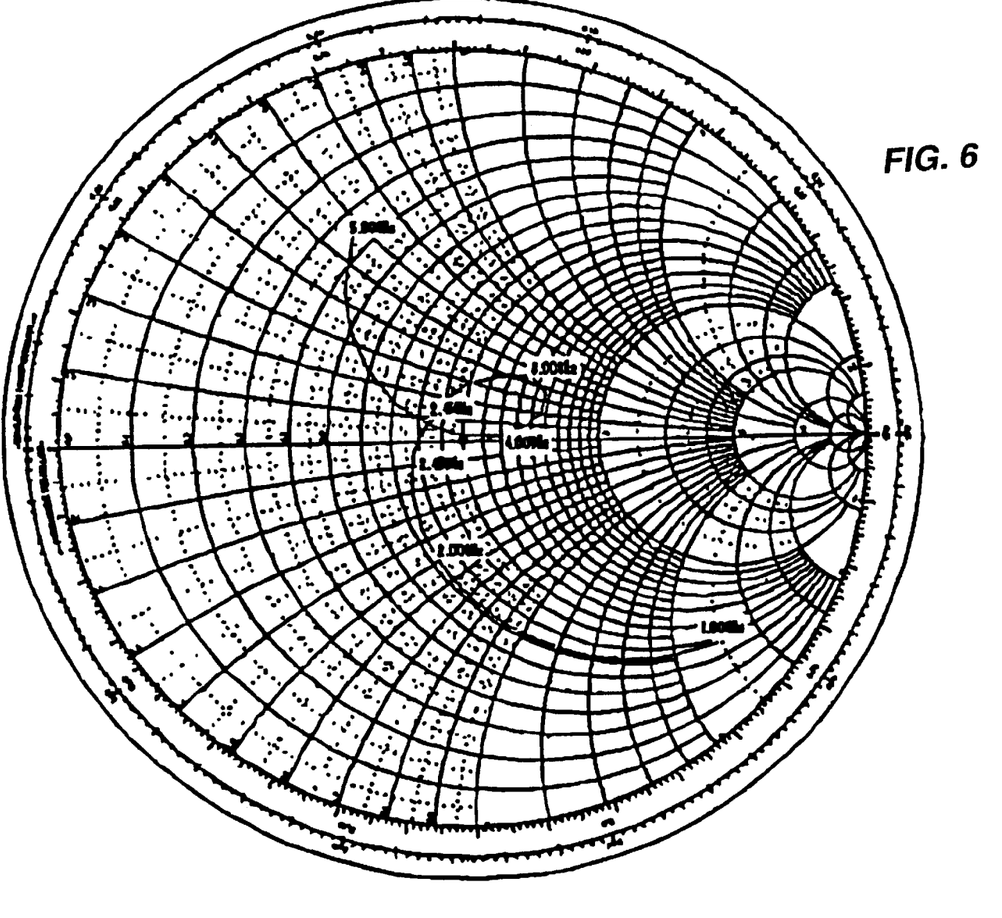
FIG. 6 is a Smith diagram showing a computer simulated projection of anticipated input S11 performance given pre-determined package parasitics and using one embodiment of an antenna assembly configured in accordance with the present invention.

In one embodiment, the LNA may be designed to have an intrinsic impedance of about 73 Ω. The expected input performance (labeled $S_{11}$), using the package parasitics and the antenna structure as a source, is expected to be as illustrated in the computer simulation shown in FIG. 6. As shown in FIG. 6, one embodiment of the LNA may provide approximately 26 dB gain with a noise factor (NF) of about 5 dB in the 2.402 to 2.480 GHz band.

TABLE I

A sample of the extracted parasitics for the LNA packaged balls H6 and H5 for a 7 by 7 $mm^2$ STP BGA package

| F(MHz) | L(nH) | | C(pF) | | R(Ω) |
|---|---|---|---|---|---|
| | Self | Mutual | Self | Mutual | Series |
| 1600 | 1.482 | 0.312 | 0.568 | 0.104 | 0.306 |
| 1900 | 1.502 | 0.320 | 0.573 | 0.105 | 0.352 |
| 2200 | 1.529 | 0.331 | 0.578 | 0.107 | 0.406 |
| 2500 | 1.560 | 0.345 | 0.585 | 0.110 | 0.453 |
| 2800 | 1.598 | 0.360 | 0.593 | 0.112 | 0.518 |

Antenna Design

One embodiment of the present antenna assembly may be part of a low cost Bluetooth module which is adhered to a host device such as a laptop computer to enable the laptop computer to communicate with other peripheral devices such as a desktop computer to a printer via a standard computer peripheral interface port. In one embodiment, the size of the Bluetooth module is approximately 10×30 $mm^2$.

With a maximum thickness of about 5.0 mm, the module may be used as a decal for appliances such as laptop computers, personal digital assistants, or household appliances such as refrigerators.

Figure 3:
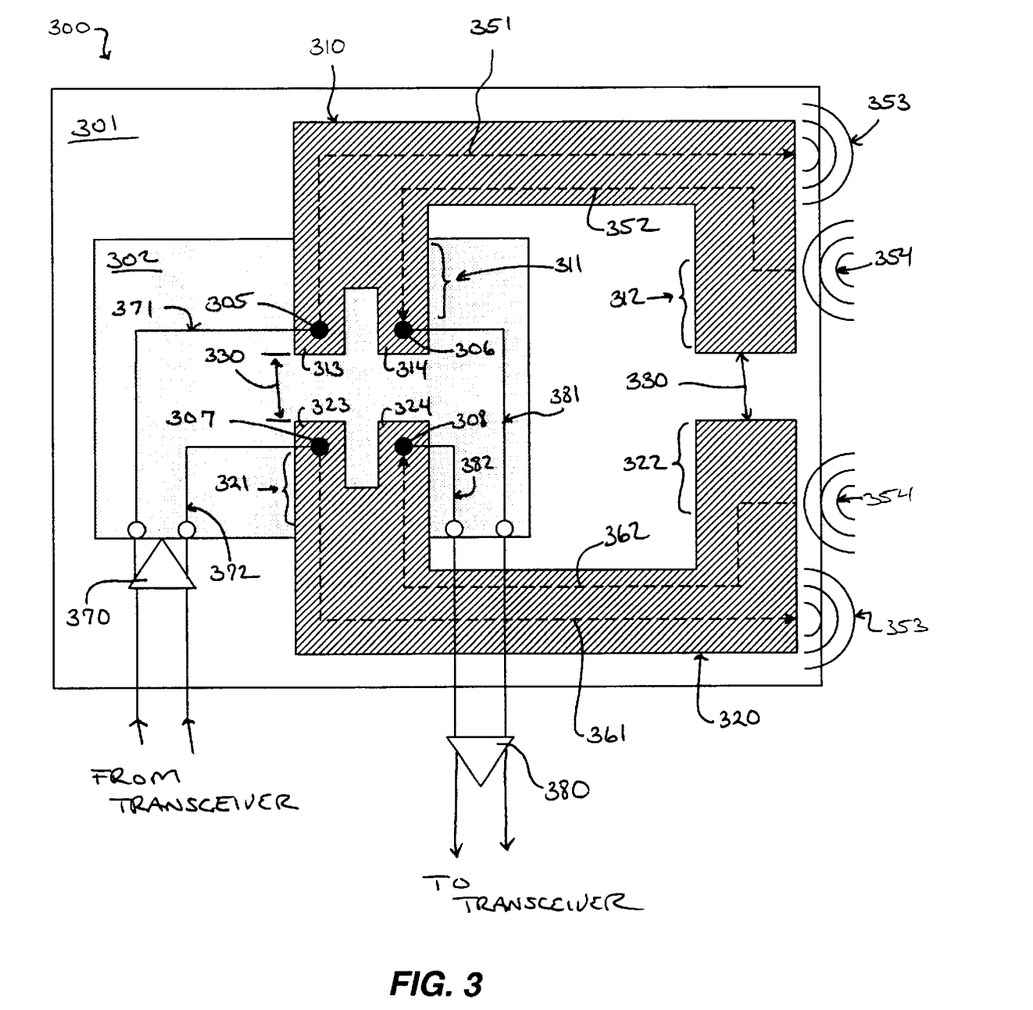
FIG. 3 is a diagram of an antenna assembly, according to one embodiment of the invention.

Referring now to FIG. 3, there is shown a diagram of one embodiment of an antenna assembly 300. Antenna assembly 300 includes a first metal region 310 and a second metal region 320 printed on a surface of a substrate. In one embodiment, the substrate may be a FR4 substrate having a thickness of about 1.0 mm. Alternatively, other types and thicknesses of substrates may be used. Regions 310 and 320 are substantially C-shaped, and the ends of the bent regions are lightly coupled to a ground plane 302 to effectively create a shunt capacitance. This capacitance is resonated by a shunt indicator trace (not shown) located proximate the feed ports.

As shown in FIG. 3, the first metal region 310 is printed on a surface of a substrate 301. First metal region 310 may be substantially C-shaped and may include a first pronged end 311 and a second end 312. First metal region 310 has a substantially uniform width throughout. Alternatively, first metal region 310 may have a varying width throughout. The first pronged end includes a first prong 314 and a second prong 313, which in one embodiment are separated by a gap. An input connecter 306 may be attached to the first prong 314 to couple the first metal region 310 to differential input of a transceiver (not shown). Alternatively, input connector 306 may be first prong 314. Similarly, output connector 305 may be attached to a second prong 313 of the first pronged end of the first metal region 310 to couple the first metal region 310 to a differential output of a transceiver (not shown). Alternatively, output connector 305 may be prong 313.

In one embodiment, second metal region 320 is printed on the same surface of substrate 301 as the first metal region 320. In one embodiment, the second metal region 320 is a mirror image of the first metal region 310. Consequently, second metal region 320 includes a first pronged end 321 and a second end 322 that correspond respectively to the first pronged end 311 and the second end 312 of the first metal region 310. An input connector 308 may be attached to a first prong 324 of the first pronged end 321 of the second metal region 320 to couple the second metal region 320 to a differential input of a transceiver (not shown). Alternatively, the input connector 308 may be first prong 324. An output connector 307 may be attached to a second prong 323 of the first pronged end 321 of the second metal region 320 to couple the second metal region 320 to a differential output of a transceiver (not shown). Alternatively, the output connector 307 may be prong 323. In another embodiment, second metal region 320 may be a non-mirror-image of the first metal region 310.

Ground plane 302 is a metal plate affixed to a surface of the substrate opposite the surface on which the first and second metal regions 310 and 320 are printed. Illustratively, the first and second metal regions 310 and 320, and the ground plate 302 are formed of copper. Alternatively, other metals may be used. As shown, ground plane 302 is square or rectangular shaped. Alternatively, other shapes may be used.

The antenna impedance may vary from application to application, depending on the dimensions of gap 330 and the cross-sectional surface area of ground plane 302. Illustratively, a ground plane 302 having a cross-sectional surface area that is small (e.g., less than ½ of) in relation to a surface area of the first and second metal regions 310 and 320, may create a high antenna impedance. Similarly, a ground plane 302 having a cross-sectional area that is large (e.g., greater than ½ of) in relation to a surface area of the first and second metal regions 310 and 320 may create a low antenna impedance. Illustratively, widening gap 330 may increase antenna impedance, while shrinking gap 330 may lower antenna impedance. Thus, circuit designers have at least two degrees of freedom by which to tune the antenna impedance to a particular application: gap 330 and ground plane 302. In one embodiment, the cross-sectional area of ground plane 302 is less than a cross-sectional area of substrate 302. In another embodiment, the cross-sectional area of ground plane 302 is less than a combined cross-sectional area of metal regions 310 and 320. In yet another embodiment, the cross-sectional area of ground plane 302 is equal to or greater than the combined cross-sectional area of metal regions 310 and 320.

Output connectors 305 and 307 connect to the solder pads on the semiconductor substrate, and are for the PA output. Thus, trace 371 connects a positive or negative terminal of the differential output 370 to output connector 305. Similarly, trace 372 connects the opposite type of terminal (e.g., negative or positive) of the differential output 370 to output connector 307.

Input connectors 306 and 308 also connect to the solder pads on the semiconductor substrate, but are for the LNA input. Thus, trace 381 connects input connector 306 to a positive or negative terminal of the differential input 380. Similarly, trace 382 connects input connector 308 to the opposite type of terminal (e.g., negative or positive) of the differential output 380.

In receiver mode, a wireless signal 354 transmitted by, and received from, a remote device is conducted through the first and second metal regions 310 and 320 and conveyed to the differential input 380 of the transceiver (not shown). Thus, in the first metal region 310, wireless signal 354 passes through (352) first metal layer 310 to input connector 306. From input connector 306, the wireless signal 354 travels via trace 381 to a differential input 380 of the transceiver. In the second metal region, wireless signal 354 passes through (362) second metal layer 320 to input connector 308. From input connector 308, the wireless signal 354 travels via trace 382 to the differential input 380 of the transceiver.

Figure 7:
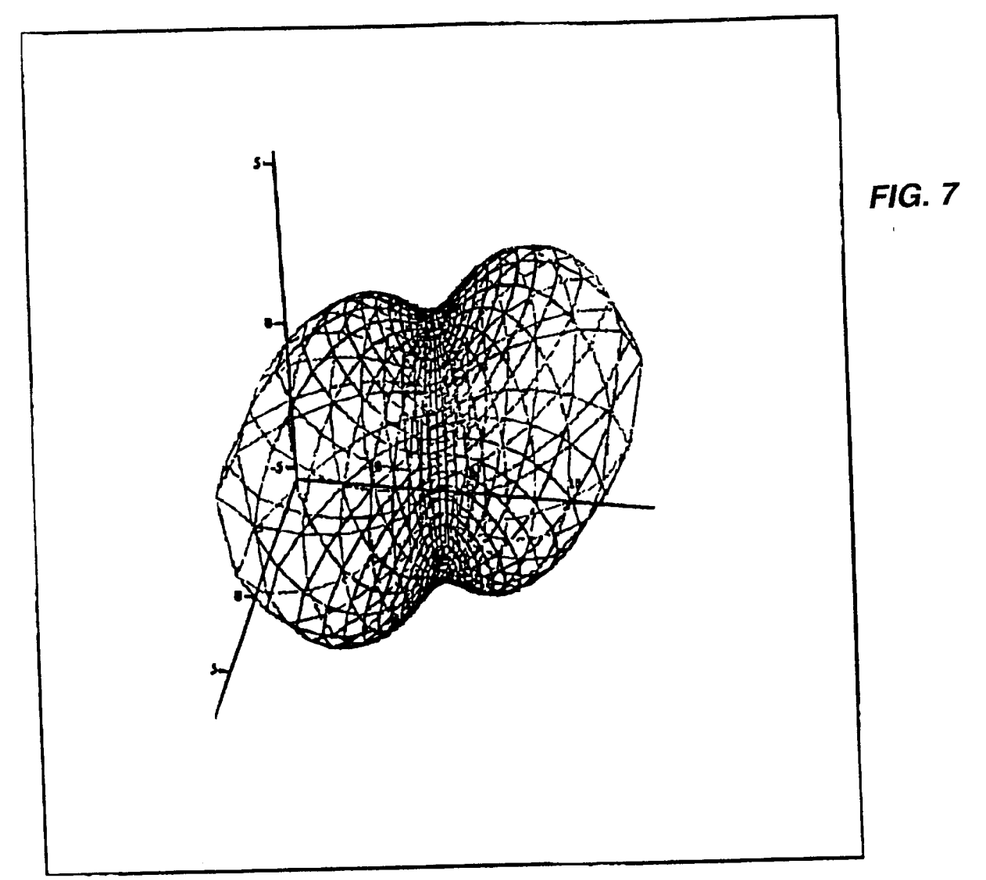
FIG. 7 is a three-dimensional antenna radiation pattern, according to one embodiment of the invention.

In transmit mode, wireless signal 353 is transmitted to a remote wireless device by conveying the signal from a differential output 370 of the transceiver (not shown) through traces 371 and 372 to output connectors 305 and 307, respectively. From output connector 305, wireless signal 353 is conducted though the first metal layer 310 and radiated outwardly to be received by a remote device. From output connector 307, wireless signal 353 is conducted through the second metal layer 320 and radiated outwardly to be received by a remote device. Illustratively, a three-dimensional radiation pattern for one embodiment of an antenna structure is shown in FIG. 7.

Figure 4A:
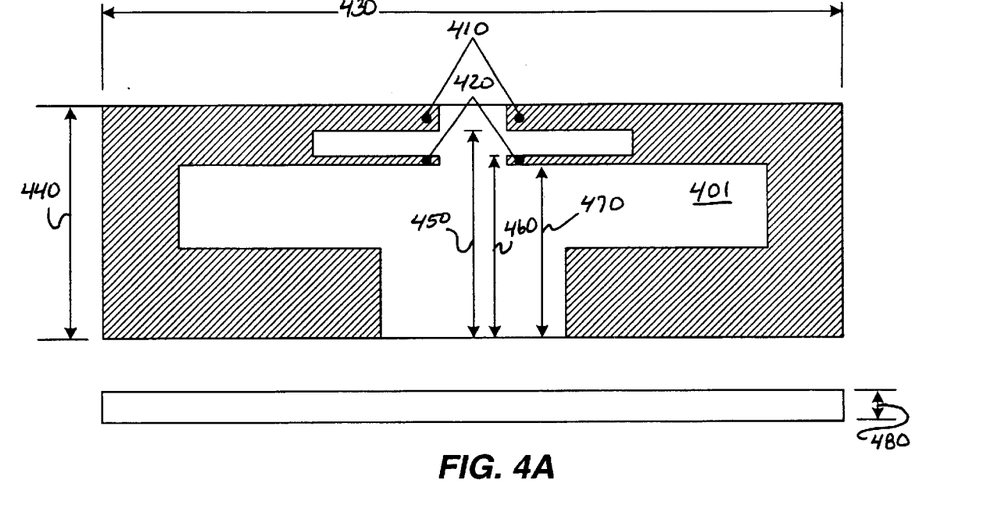
FIG. 4A is a diagram of an antenna assembly, according to another embodiment of the invention.

FIG. 4A is a plan view of an antenna assembly 400 printed on a surface of a substrate 401. As shown, antenna assembly 400 includes two substantially C-shaped metal regions 412 and 422. Metal region 412 includes port 410, which may be connected to a power amplifier output. Metal region 422 includes port 420, which may be connected to a low noise amplifier input. Illustratively, substrate 401 may have a length of about 30.0 mm and a width of about 10.0 mm. Distance 450 may measure approximately 9.0 mm. Distance 460 may measure about 8.15 mm; and distance 470 may measure about 8.0 mm. Thickness 480 measures approximately 1.0 mm.

Figure 4B:
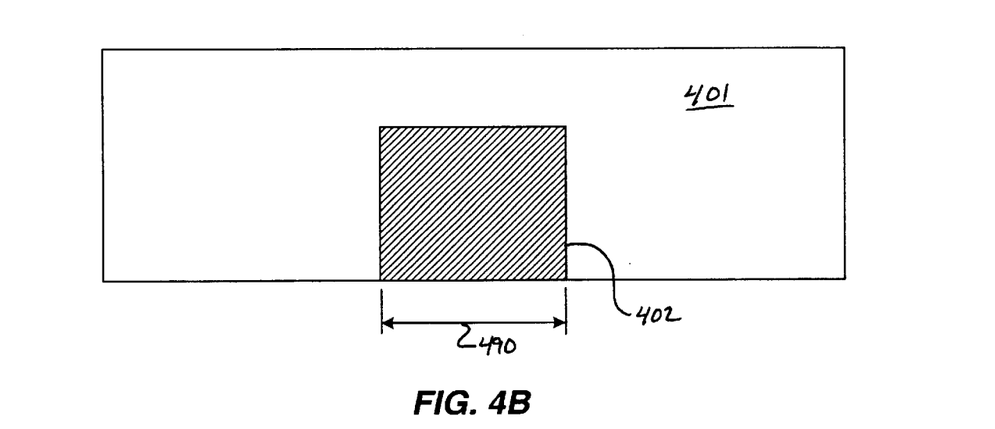
FIG. 4B is a diagram of an ground plane, according to one embodiment of the invention.

FIG. 4B is a bottom view of the antenna assembly 400 shown in FIG. 4. In this view, a ground plane 402 is shown affixed to the bottom surface of substrate 401. In one embodiment, the bottom surface is a surface of a substrate opposite the surface on which the metal regions 412 and 422 are printed. Illustratively, ground plane 402 has a width and height of approximately 12.0 mm.

Shown below are Tables II–IV. Table I has been previously described. Table II illustrates the resultant Port A impedance with Port B terminated at 35-j22 Ω. Table III illustrates the resultant Port B impedance with Port A terminated at 165-j20 Ω. Table IV illustrates the overall results for one embodiment of an antenna structure. Port A corresponds to the PA output 410 in FIG. 4A. Port B corresponds to the LNA input 420 in FIG. 4A.

TABLE II

Resultant Port A impedance with Port B terminated at 35-j22 Ω

| Frequency (MHz) | Impedance (Ω) |
|---|---|
| 2.400 | 248 + j68 |
| 2.442 | 226 + j56 |
| 2.484 | 202 + j52 |

TABLE III

Resultant Port B impedance with Port A terminated at 165-j20 Ω

| Freguency (MHz) | Impedance (Ω) |
|---|---|
| 2.400 | 78 + j72 |
| 2.442 | 73 + j80 |
| 2.484 | 70 + j90 |

TABLE IV

Overall result of this antenna design

| | PA port | LNA port |
|---|---|---|
| Freq. band | 2.40 to 2.48 GHz | 2.40 to 2.48 GHz |
| Impedance | 300 Ω nominal | 73 Ω nominal |
| VSWR | 1.8:1 max | 1.75:1 Max |
| Efficiency | 65% | 86% |
| Dimensions | 10 × 30 × 5 mm$^2$ | 10 × 30 × 5 mm$^2$ |
| Peak gain | 0 ± 0.5 dBi | 0 ± 0.5 dBi |

Although the present invention is described herein with reference to a specific preferred embodiment, many modifications and variations therein will readily occur to those with ordinary skill in the art. Accordingly, all such variations and modifications are included within the intended scope of the present invention as defined by the following claims.

What is claimed is:

1. An antenna assembly, comprising:
a first metal region printed on a substrate; and
a second metal region printed on the substrate and separated from the first metal region by a gap, wherein the second metal region includes a first pronged end and a second end that correspond, respectively, to a first pronged end and a second end of the first metal region, the pronged ends of each metal region connected to a transceiver having a differential input and a differential output.

2. An antenna assembly as in claim 1, wherein the first metal region is of a substantially uniform thickness and width, and is substantially C-shaped.

3. An antenna assembly as in claim 1, wherein the second metal region is of a substantially uniform thickness and a width, and is substantially C-shaped.

4. An antenna assembly as in claim 3, wherein the second metal region is a mirror image of the first metal region.

5. An antenna assembly as in claim 3, wherein the second metal region is not a mirror image of the first metal region.

6. An antenna assembly as in claim 3, wherein an impedance of the antenna is dependent on a size of the gap separating the first and second metal regions.

7. An antenna assembly as in claim 3, further comprising:
a ground plane positioned on the substrate proximate the first and second metal regions.

8. An antenna assembly as in claim 7, wherein an impedance of the antenna is dependent on a total cross-sectional area of the ground plane.

9. An antenna assembly as in claim 8, wherein the ground plane is a metal plate attached to the substrate.

10. An antenna assembly as in claim 8, wherein the ground plane is attached to the substrate on a surface thereof opposite another surface of the ground plane to which the first and second metal regions are attached.

11. An antenna assembly as in claim 8, wherein the ground plane is square.

12. An antenna assembly as in claim 8, wherein the ground plane is rectangular.

13. An antenna assembly as in claim 8, wherein a cross-sectional surface area of the ground plane is less than a cross-sectional surface area of the substrate.

14. An antenna assembly as in claim 8, wherein a cross-sectional surface area of the ground plane is greater than a combined cross-sectional surface area of each of the first and second metal regions.

15. An antenna assembly as in claim 8, wherein a cross-sectional surface area of the ground plane is less than a combined cross-sectional surface area of each of the first and second metal regions.

16. An antenna assembly as in claim 3, further comprising:
an input connector attached to the first pronged end of the first metal region, the input connector to couple with the differential input of the transceiver.

17. An antenna assembly as in claim 16, wherein the input connector is attached to a prong of the first pronged end of the first metal region.

18. An antenna assembly as in claim 16, wherein the input connector is a prong of the first pronged end of the first metal region.

19. An antenna assembly as in claim 16, further comprising:
an output connector attached to the first pronged end of the first metal region, the output connector to couple with the differential output of the transceiver.

20. An antenna assembly as in claim 19, wherein the output connector is attached to a prong of the first pronged end of the first metal region.

21. An antenna assembly as in claim 19, wherein the output connector is a prong of the first pronged end of the first metal region.

22. An antenna assembly as in claim 3, further comprising:
an input connector attached to the first pronged end of the second metal region.

23. An antenna assembly as in claim 22, wherein the input connector is attached to a prong of the first pronged end of the second metal region.

24. An antenna assembly as in claim 22, wherein the input connector is a prong of the first pronged end of the second metal region.

25. An antenna assembly as in claim 3, further comprising:
an output connector attached to the first pronged end of the second metal region.

26. An antenna assembly as in claim 25, wherein the output connector is attached to a prong of the first pronged end of the second metal region.

27. An antenna assembly as in claim 25,wherein the output connector is a prong of the first pronged end of the second metal region.

28. An antenna assembly as in claim 1, wherein an impedance of the antenna is dependent upon both a size of the gap and upon a cross-sectional surface area of a ground plane attached to the substrate.

29. An antenna assembly as in claim 1, wherein the first metal region and the second metal region are printed on a surface of the substrate.

30. An antenna assembly as in claim 29, wherein a cross-sectional surface area of a surface on which the first and second metal regions are printed does not exceed 10 by 30 mm$^2$.

31. An antenna assembly as in claim 29, wherein the first and second metal regions are components of a Bluetooth-compatible module, the module to be attached to a host device to enable the host device to communicate with other peripheral devices via a wireless connection.

32. An antenna assembly which is a component of a Bluetooth-compatible module, the antenna assembly, comprising:
a first metal region printed on a substrate; and
a second metal region printed on a substrate and separated from the first metal region by a gap, wherein the second metal region includes a first pronged end and a second end that correspond, respectively, to a first pronged end and a second end of the first metal region, the pronged ends of each metal region connected to a transceiver having a differential input and a differential output.

33. An antenna assembly as in claim 32, wherein the first metal region is of a substantially uniform thickness and width, and is substantially C-shaped.

34. An antenna assembly as in claim 32, wherein the second metal region is of a substantially uniform thickness and a width, and is substantially C-shaped.

35. An antenna assembly as in claim 34, wherein the second metal region is a mirror image of the first metal region.

36. An antenna assembly as in claim 34, wherein the second metal region is not a mirror image of the first metal region.

37. An antenna assembly as in claim 34, wherein an impedance of the antenna is dependent on a size of the gap separating the first and second petal regions.

38. An antenna assembly as in claim 34, further comprising:
a ground plane positioned on the substrate proximate the first and second metal regions.

39. An antenna assembly as in claim 38, wherein an impedance of the antenna is dependent on a total cross-sectional area of the ground plane.

40. An antenna assembly as in claim 39, wherein the ground plane is a metal plate attached to the substrate.

41. An antenna assembly as in claim 39, wherein the ground plane is attached to the substrate on a surface thereof opposite another surface of the ground plane to which the first and second metal regions are attached.

42. An antenna assembly as in claim 39, wherein the ground plane is square.

43. An antenna assembly as in claim 39, wherein the ground plane is rectangular.

44. An antenna assembly as in claim 39, wherein a cross sectional surface area of the ground plane is less than a cross-sectional surface area of the substrate.

45. An antenna assembly as in claim 39, wherein a cross-sectional surface area of the ground plane is greater than a combined cross-sectional surface area of each of the first and second metal regions.

46. An antenna assembly as in claim 39, wherein a cross-sectional surface area of the ground plane is less than a combined cross-sectional surface area of each of the first and second metal regions.

47. An antenna assembly as in claim 34, further comprising:

an input connector attached to the first pronged end of the first metal region, the input connector to couple with the differential input of the transceiver.

48. An antenna assembly as in claim 47, wherein the input connector is attached to a prong of the first pronged end of the first metal region.

49. An antenna assembly as in claim 47, wherein the input connector is a prong of the first pronged end of the first metal region.

50. An antenna assembly as in claim 47, further comprising:
an output connector attached to the first pronged end of the first metal region, the output connector to couple with the differential output of the transceiver.

51. An antenna assembly as in claim 50, wherein the output connector is attached to a prong of the first pronged end of the first metal region.

52. An antenna assembly as in claim 50, wherein the output connector is a prong of the first pronged end of the first metal region.

53. An antenna assembly as in claim 34, further comprising:
an input connector attached to the first pronged end of the second metal region.

54. An antenna assembly as in claim 53, wherein the input connector is attached to a prong of the first pronged end of the second metal region.

55. An antenna assembly as in claim 53, wherein the input connector is a prong of the first pronged end of the second metal region.

56. An antenna assembly as in claim 34, further comprising:
an output connector attached to the first pronged end of the second metal region.

57. An antenna assembly as in claim 56, wherein the output connector is attached to a prong of the first pronged end of the second metal region.

58. An antenna assembly as in claim 56, wherein the output connector is a prong of the first pronged end of the second metal region.

59. An antenna assembly as in claim 32, wherein an impedance of the antenna is dependent upon both a size of the gap and upon a cross-sectional surface area of a ground plane attached to the substrate.

60. An antenna assembly as in claim 32, wherein the first metal region and the second metal region are printed on a surface of the substrate.

61. An antenna assembly as in claim 60, wherein a cross-sectional surface area of a surface on which the first and second metal regions are printed does not exceed 10 by 30 mm$^2$.

62. A method, comprising:
receiving a wireless signal from a remote device in a first and second metal regions formed on a substrate, each metal region being a mirror image of the other and separated by a gap;
conducting the wireless signal through the first metal region to a first differential input of a transceiver coupled with the first metal region; and
conducting the wireless signal through the second metal region.

63. A method as in claim 62, further comprising:
conveying the wireless signal from the second metal region to a second differential input of the transceiver.

64. A method, comprising:
outputting a wireless signal from a first and second differential outputs of a transceiver; and
conducting the wireless signal through a first and second metal regions positioned on a substrate, the first metal region being connected to the first differential output and the second metal region being connected to the second differential output.

65. A method as in claim 64, further comprising:

transmitting the wireless signal through the first metal region to a remote device.

66. A method as in claim 65, further comprising:

transmitting the wireless signal through the second metal region a remote device.

67. A method as in claim 64, further comprising:

transmitting the wireless signal through both the first and second metal regions to a remote device.

68. A method, comprising:

receiving a wireless signal from a remote device in a first and second metal regions formed on a substrate, each metal region separated by a gap;

conducting the wireless signal through the first metal region to a first differential input of a transceiver coupled with the first metal region; and conducting the wireless signal through the second metal region to a second differential input of the transceiver coupled with the second metal region.

* * * * *